(12) United States Patent
Tsironis (10) Patent No.: US 6,414,563 B1
(45) Date of Patent: Jul. 2, 2002

(54) LOW-LOSS MICROWAVE DEVICE TEST FIXTURE WITH ADJUSTABLE BLOCKS

(75) Inventor: Christos Tsironis, Kirkland (CA)

(73) Assignee: Focus Microwaves Inc., Quebec (CA)

( * ) Notice: Subject to any disclaimer, the term of this patent is extended or adjusted under 35 U.S.C. 154(b) by 9 days.

(21) Appl. No.: 09/670,806

(22) Filed: Sep. 28, 2000

Related U.S. Application Data (60) Provisional application No. 60/186,202, filed on Mar. 1, 2000.

(51) Int. Cl.[7] ................................................ H03H 7/38
(52) U.S. Cl. .......................................... 333/33; 333/246
(58) Field of Search ........................... 333/33, 246, 260; 324/765–769

(56) References Cited

U.S. PATENT DOCUMENTS 4,365,195 A * 12/1982 Stegens .................. 333/246 X
5,075,630 A * 12/1991 Babbitt et al. .......... 333/246 X

* cited by examiner

Primary Examiner—Justin P. Bettendorf
(74) Attorney, Agent, or Firm—McDermott, Will & Emery (57) ABSTRACT

The present invention relates to a low-loss microwave device test fixture which presents as little losses as possible along the signal path and which can permit impedance transformations. The test fixture includes a frame having two opposite extremities, a top, a bottom, a height and a width. The device is further provided with a device supporting column located between the two extremities, having a top surface lying below the top of the frame adapted to receive the device. Two adjustable blocks are further provided, each located between the device supporting column and an opposite extremity, each of the blocks being vertically adjustable. Between the adjustable blocks and the top of the device are two brackets, each for receiving a flange of a device, each of the brackets being secured to an opposite extremity of the frame. The device can be secured to the column and the column and the blocks can be vertically adjusted. The vertical adjustment permits the impedance transformation, and air is used as a dielectric to minimise the losses along the signal path.

8 Claims, 6 Drawing Sheets

LOW-LOSS MICROWAVE DEVICE TEST FIXTURE WITH ADJUSTABLE BLOCKS

The present application claims priority to U.S. provisional application No. 60/186,202, filed Mar. 1, 2000.

FIELD OF THE INVENTION

The present invention relates to a low-loss microwave device test fixture.

DESCRIPTION OF THE PRIOR ART

Low-loss microwave device test fixtures are typically used in automatic and manual RF/microwave (200 MHz to 26.5 GHz) measurement and testing of microstrip and coplanar devices (hereinafter "DUT") operating in linear or non-linear mode.

These test fixtures are used within measurement set-ups to provide a mechanical base on which to physically install a RF/microwave device to be measured, such as transistor, diode, MMIC, etc. and provide a means to create a signal path from the inputs and the outputs of the devices to measurement equipment. The use of a test fixture is dictated by the fact that the packages in which devices are delivered are meant for PC-board mounting applications and cannot be hooked directly on test equipment connectors.

Figure 7A:
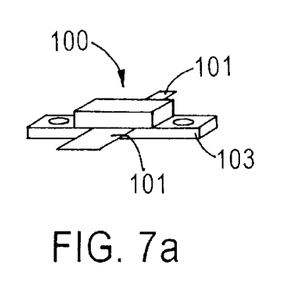
FIGS. 7a and 7b are schematic representations of typical DUTs used with the device of the present invention.
Figure 7B:
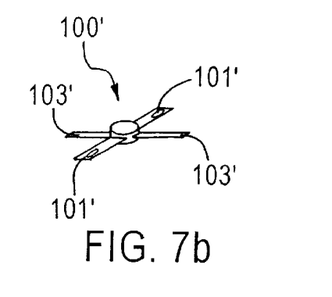

Generally, the packages in which the devices 100, 100' are delivered comprise a main body 103, 103', usually meant to be secured to a circuit ground, and two or more flanges 101, 101', identified as inputs, outputs and sometimes grounds as shown in FIGS. 7a and 7b. All these elements are internally connected to different sections of the actual microwave microchip die. In all existing fixtures, devices are positioned and retained in place through a variety of methods (soldering, clamping, spring loading, etc.), and can be adjusted to different packages by replacing, adding or removing mechanical sections and PC-boards optimized for each specific application.

In almost all prior art fixtures, the transitions between the fixture connectors and the device package flanges are realised by using printed copper patterns over some dielectric substrate. The reason for this is that such an arrangement permits easy adaptation to different packages just by replacing a PC-board, as well as the possibility of achieving impedance transformation, consequently allowing the characterization of very low impedance devices. Also, each transition can be easily designed for the specific package dimensional characteristics (flanges of different sizes, placed at various heights, etc.). In particular, this allows the characterisation of devices mounted within geometrically asymmetrical packages. Unfortunately, such an approach also has a major draw-back: all known dielectric materials used in substrates have high ohmic losses compared to air.

In the very case in which devices presenting extremely low impedances at one of their ports have to be tested using a Load Pull Test System, which varies the load or source impedance seen by the devices at their ports, the ohmic losses generated by the dielectric material cannot be ignored, effectively putting a limit to the lowest possible impedance that can be accurately generated by the load pull test system. In fact, non-resistive losses can always be extracted mathematically from the values measured (by a process known as "de-embedding"). However, it is of no importance to know exactly the effect of the ohmic losses in order to create the appropriate test conditions for the device; it is the fact that these ohmic losses limit the lowest available impedance presented to the device that matters. The most obvious approach to solve this problem is to design a fixture presenting as little losses as possible along the signal path. This is done by using dielectrics presenting as little ohmic losses as possible, the most appropriate dielectric for this purpose being empty space, closely followed by air.

Figure 4:
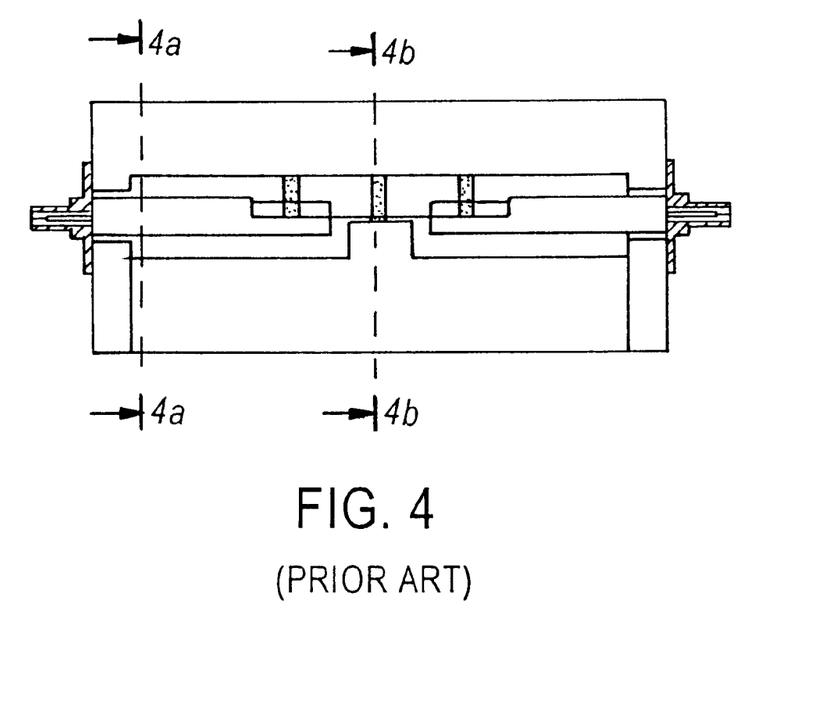
FIGS. 4, 4a and 4b are, respectively, a front plan view, and schematic cross-sectional representations taken along lines 4a and 4b of a test fixture according to the prior art.
Figure 4A:
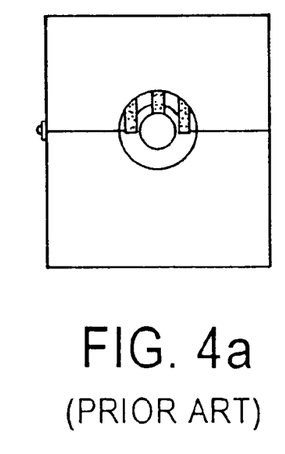
Figure 4B:
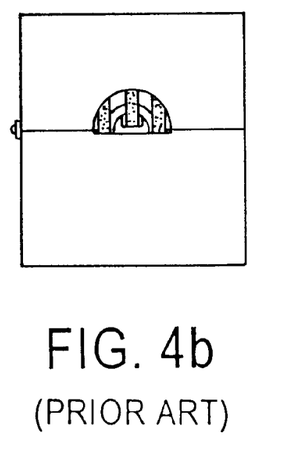
Figure 5:
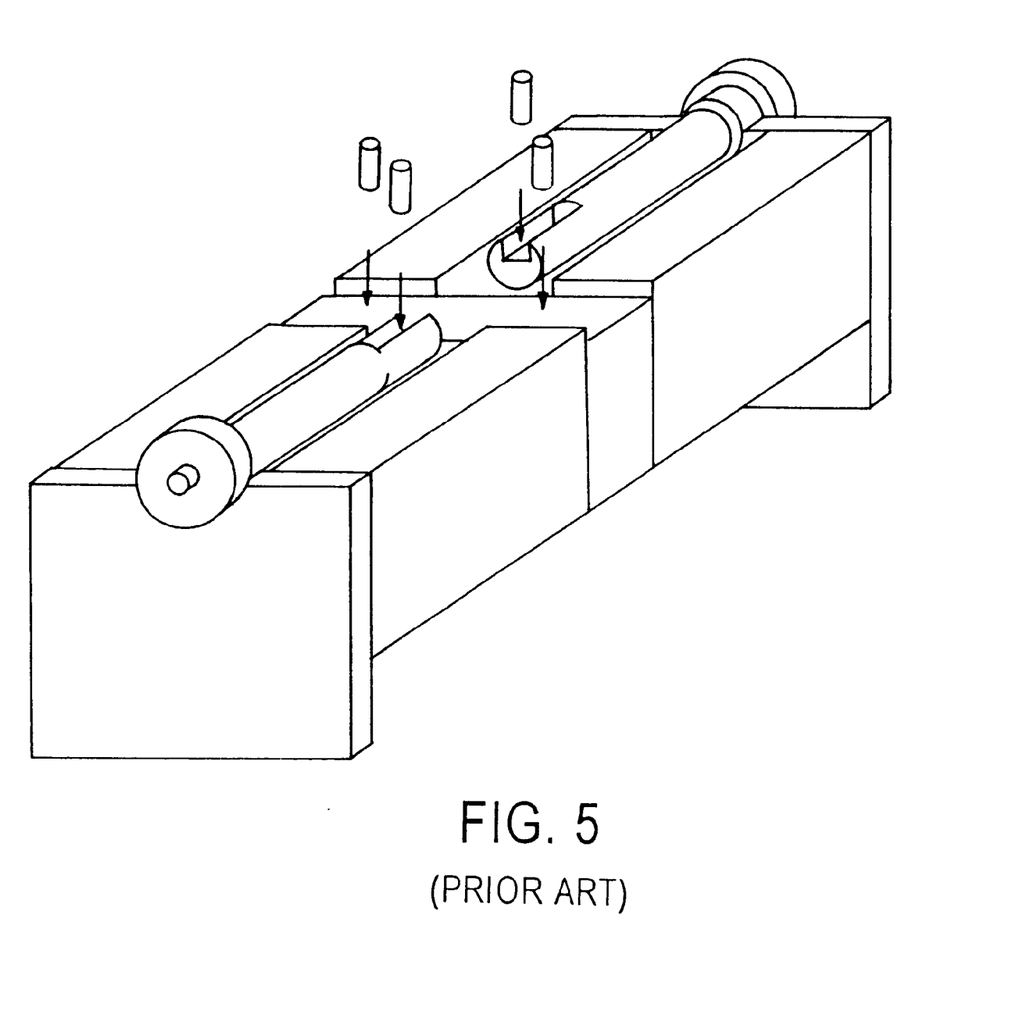
FIG. 5 is a perspective view of the prior art fixture with the top removed.

However, up to now, air has been used as a dielectric in commercially available microwave device test fixtures only once. This test fixture is illustrated in FIGS. 4 and 5, identified as "Prior Art". The test fixture has conductors having flange receiving portions. A section at the bottom of the device is custom-made for each separate DUT that is to be tested with the test fixture. Accordingly, whenever a new DUT is to be tested, the custom section must be replaced. Furthermore, this test fixture includes pressure columns (shown in solid in FIGS. 4, 4a and 4b) in isolating material to maintain the DUT signal flanges in place, which by definition introduces losses; additionally, pressure columns are provided, again in isolating material, to hold the DUT ground flanges in place (see FIG. 5).

This specific test fixture is inherently limited to small, low-power devices. Another limitation of this test fixture is that it does not provide any impedance transformation with the same custom section.

It is known from theory that achieving effective transitions using air as a dielectric and presenting good impedance transformation characteristics (more than 5:1) involves transitions of an extremely large size. Recent progress in measurement equipment and technologies however permits the direct measurement of extremely low impedances over very large frequency ranges. Consequently, investigating an approach using air has become far more interesting.

SUMMARY OF THE INVENTION

It is an object of the invention to provide a microwave test fixture which presents as little losses as possible along the signal path, and which can permit impedance transformations. In accordance with the invention, this object is achieved with a test fixture which said device has at least two flanges lying on an axis and projecting on opposite directions from the device, and at least one ground flange, said test fixture comprising:

a frame having two opposite extremities, a top, a bottom, a height, and a width;

a device supporting column located between said opposite extremities, having a top surface lying below said top of said frame and adapted to receive said device, said column having a height less than said height of said frame;

two adjustable blocks, each located between the device supporting column and an opposite extremity, said blocks being vertically adjustable;

two brackets for receiving a flange from the device, the brackets lying above the column and the blocks, each bracket being secured to an opposite extremity of the frame;

means for securing said device to said column; and means for securing said column and said blocks at a given vertical position.

The advantages provided by the microwave test fixture according to the present invention are the following: the fixture uses air as the exclusive dielectric transmission media; the characteristic impedance may be varied by continuously changing the distance of the signal carrying conductor from the ground plane; and the fixture can inherently be securely attached to a wide variety of low and high power microwave transistor packages in order to make their testing possible.

BRIEF DESCRIPTION OF THE DRAWINGS

The present invention and its advantages will be more easily understood after reading the following non-restrictive description of preferred embodiments thereof, made with reference to the following drawings in which.

DESCRIPTION OF PREFERRED EMBODIMENTS OF THE INVENTION

The present invention concerns a novel microwave low-loss fixture 10 for testing microwave devices 100, 100'. In this fixture 10, transitions from connectors 36 to device flanges 101, 101' do not rely on any dielectric substrate whatsoever. Two versions of the test fixture are described and form part of the invention:

1) A first preferred embodiment of the invention includes only a small amount of dielectric material within the commercially available connectors which are used to support the central conductor; and 2) A second preferred embodiment of the invention uses custom made connector assemblies without any dielectric support for the central conductors (known in the microwave engineering community as "beadless connectors", in order to further reduce insertion loss).

Consequently, in both cases ohmic losses are extremely low, which is the objective of the invention and very desirable when low-impedance (less than 1 Ohm) devices need to be characterized, as, in these conditions, the influence of the test fixture losses in the measurement become critical for accuracy and limits the available reflection factor that can be synthesized at the DUT reference plane by means of a high reflection tuner.

Features from which this new fixture derives its benefits are the design of the device package flange holding brackets, and, more importantly, the specific approach used to guarantee a characteristic impedance within the signal path as close as possible to the desired one (50 Ohm, 75 Ohm, etc.).

The novel microwave device test fixture 10 according to the present invention is based on an innovative transition technique between coaxial and microstrip structures and has been optimized for each particular transistor package, in order to provide very low insertion loss and maximum return loss.

Figure 1:
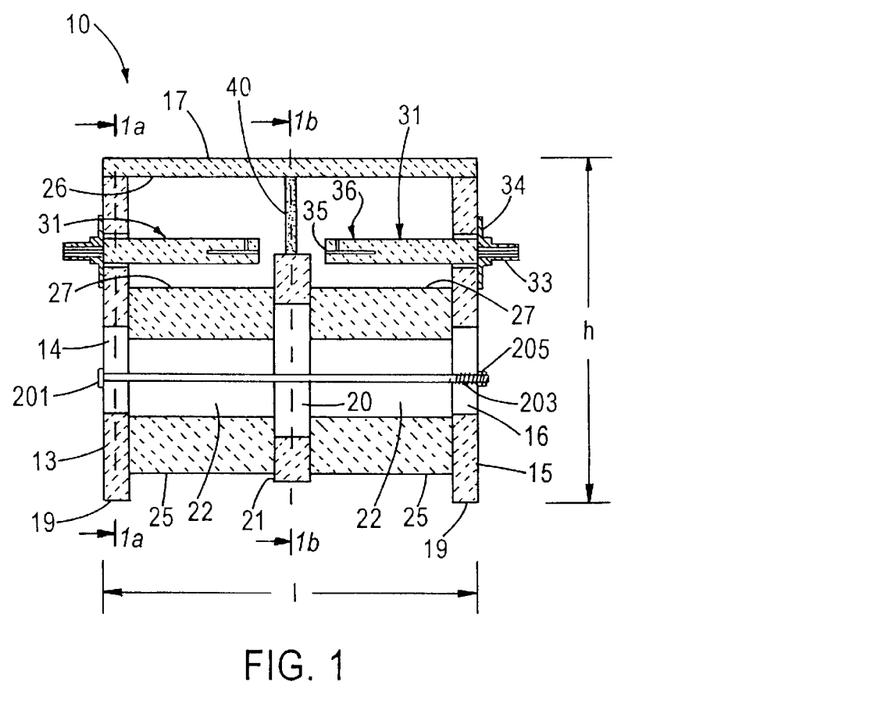
FIGS. 1, 1a and 1b are, respectively, a front plan view, and schematic cross-sectional representations taken along lines 1a and 1b, of a microwave low-loss fixture for testing microwave devices according to a preferred embodiment of the invention.
Figure 1A:
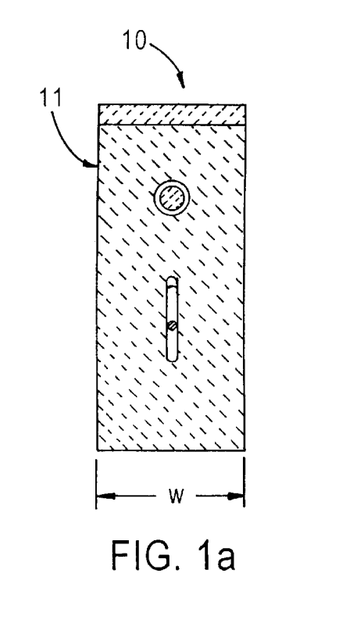
Figure 1B:
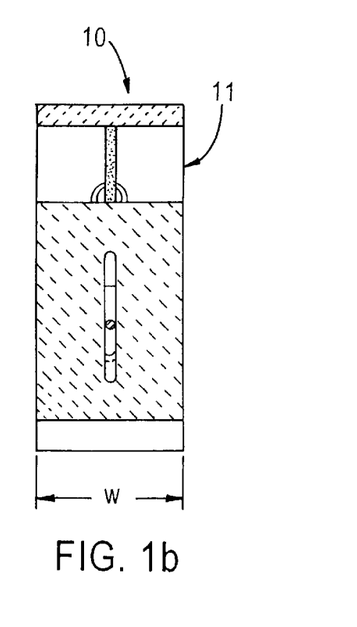
Figure 2:
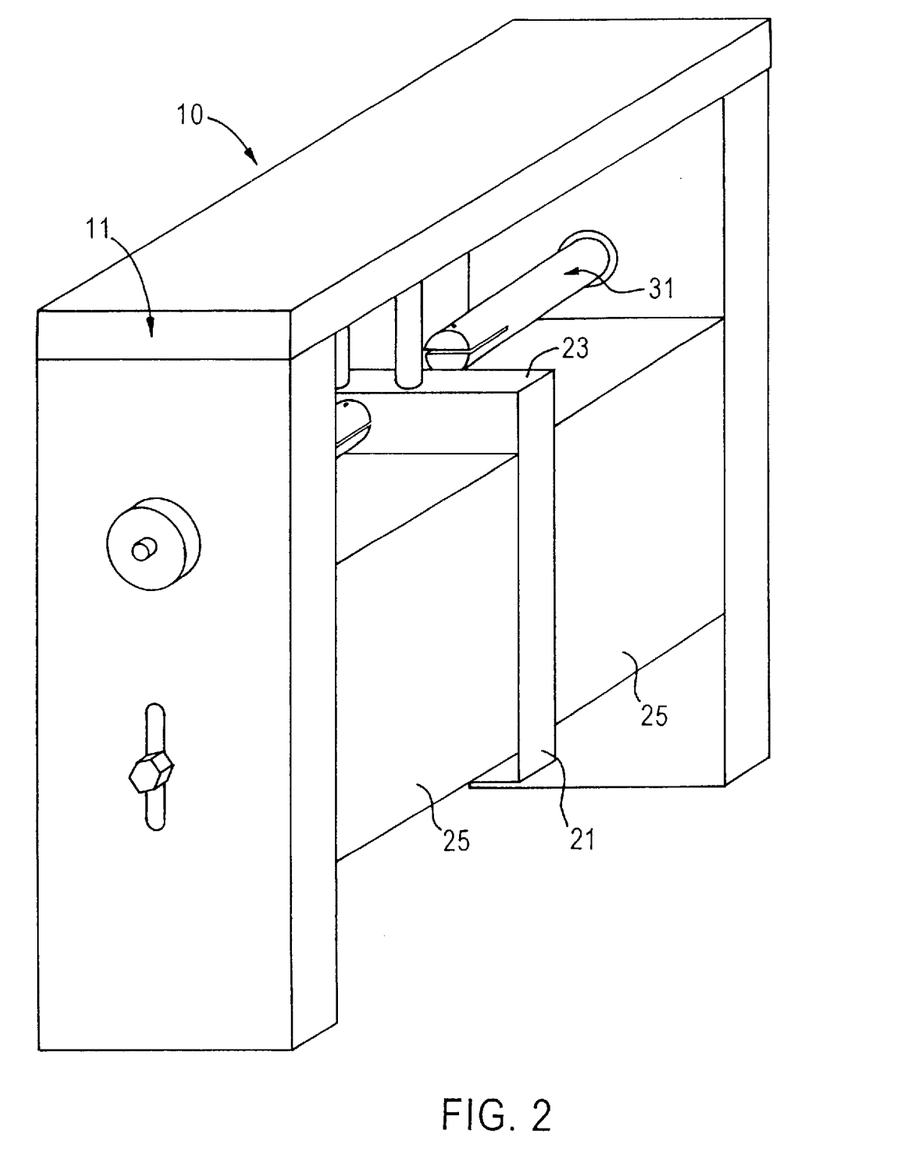
FIG. 2 is a perspective view of the fixture of FIG. 1.

In the test fixture 10 of the present invention, the characteristic impedance is controlled all along the signal path by a vertically asymmetrical geometry which compensates for mismatches at the connector and flange level (see FIGS. 1 and 2). The flanges themselves are positioned and held in place by a novel bracket (see FIGS. 1 and 2) which not only provides excellent mechanical contact but also generates less ohmic losses than traditional methods. The basic principle of the brackets of the present invention is that the flanges are maintained in place by pressure means, either by a spring-loaded contact, a screw, or other similar means. This guarantees perfect and, also extremely important for microwave testing purposes, reproducible, contact for the signal path.

Adaptation to different sorts of packages is easily achieved by adding, removing, or replacing metallic sections below the body of the device.

It is important to mention that the low-loss microwave device test fixture 10 of the present invention, or test-jig, can easily be calibrated using a TRL (Through Reflect Line) technique. Unlike the traditional calibration techniques using precise open, short and 50 or 75 Ohms reference terminations, TRL does not require perfect or quasi-perfect references as long as the characteristic impedance of the delay-fine used in the calibration is known. Now, in this novel test fixture, the characteristic impedance can be very easily adjusted to the desired characteristic impedance (usually 50 Ohms) by adjusting the vertical distance between the through-line and the inserts, and minimizing the reflection loss as measured on a network analyzer (see FIG. 3). Finally, as the dielectric constant of air ($\epsilon_0$) is considerably lower than the one of any substrate, the width of the through-line has a much lower influence on the characteristic impedance measured between the input and the output of the test fixture. Consequently, the calibration set-up used for one transistor package can be used, achieving acceptable precision, with other similar packages.

Referring now to FIGS. 1 and 2, the low-loss microwave device test fixture of the present invention is adapted to support devices 100, 100' having at least two flanges 101, 101' lying on an axis and projecting on opposite directions from the device, and at least one ground flange 103, 103'. One of the flanges is denoted input, and the other flange is denoted output. FIGS. 7a and 7b show two such devices, although it should be understood that a variety of different devices can be used with the test fixture 10 of the present invention, as will be apparent from the following description.

The test fixture 10 of the present invention has a frame 11 having two opposite extremities 13, 15, a top 17, a bottom 19, a height h, a width w, and a length l.

The fixture 10 further includes a device supporting column 21, located between the opposite extremities 13, 15, which has a top surface 23 lying below the bottom surface 26 of the frame 11 and adapted to receive the device 100. The device supporting column 21 has a height which is less than the height h of the frame 11.

The fixture 10 also includes two adjustable blocks 25, preferably identical, but not necessarily so, each located between the device supporting column 21 and an opposite extremity 13 or 15, as the case may be. The blocks 25 are vertically adjustable, so that the distance between the top surface 27 of each block 25 and the bottom surface 26 of the top 17 of the frame can be adjusted.

The fixture includes two conductors 31, preferably identical, each of the conductors 31 having two opposite ends 33, 35. End 33 is provided with a connector 34 to connect conductor 31 to an external device. End 35 is provided with a bracket 36 for receiving a flange of a device 100. The conductors 31 lie on an axis between the bottom surface 26 of the top 17 and the top surface 27 of the blocks 25.

Figure 6A:
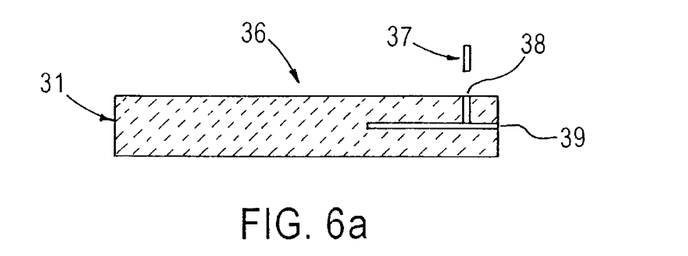
FIGS. 6a, 6b and 6c are schematic representations of various brackets which can be used with the device of the present invention.

The brackets 36 are preferably provided with a longitudinal slot 39, having a predetermined length and width, that is adapted to receive a flange from a variety of different devices, the latter having different widths and different lengths. The brackets 36 are further provided with pressure means, for securely retaining the flange within the slot 39. As better shown in FIGS. 6a, 6b and 6c, the pressure means can include a screw or a spring, or can simply be the shape of the slot 39. More specifically, FIG. 6a shows a variation where the slot 39 is substantially rectangular. A flange of a device will be held in place within the slot by a screw 37 which will be screwed in hole 38.

Figure 6B:
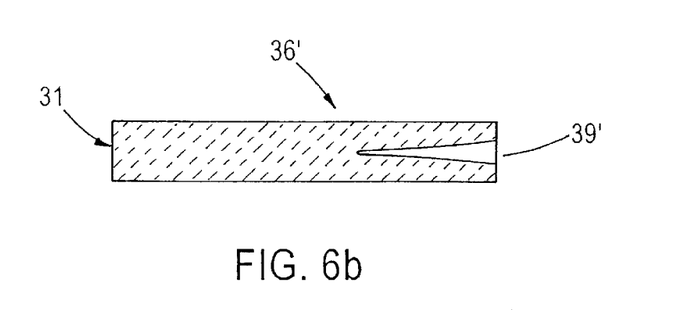

Alternatively, the slot 39', illustrated in FIG. 6b, will taper inwardly and the flange of the DUT will be secured by the shape of the slot, which is sufficiently elastic, in combination with the flange, to be securely wedged in place.

Figure 6C:
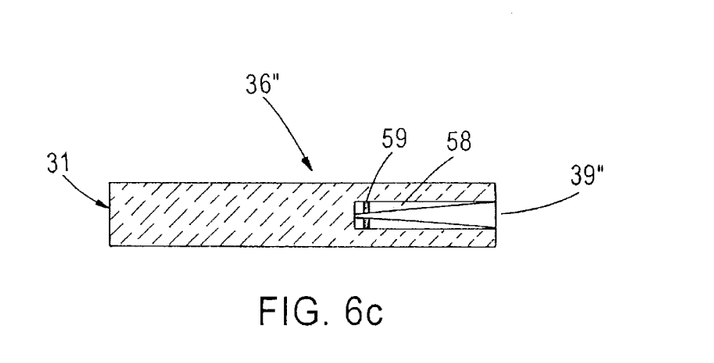

Again, alternatively, the slot 39", as shown in FIG. 6c, is rectangular, but larger than the one shown in FIG. 6a. The slot is provided with strips 58, pivotally secured to bracket 32" at the open area. The rearward portion of strip 58 is maintained away from the slot 39" by resilient number 37. When the DUT flange is inserted, it compresses number 37 to securely wedge the flange therein. It will be obvious that strip 58 must be conductive, but, element 57 does not tend to be.

Also, the embodiment shown in FIGS. 6a, 6b and 6c should not be interpreted as being limitative, and other ways of securely effecting a contact between connector 31 and the flange of the DUT is within the scope of the invention.

The purpose of the pressure means is to insure good contact between the conductor 31 and the flange of the device during the test.

As can be seen from FIGS. 1 and 2, the conductors project towards the device supporting column 21, and have a length less than half the length l of the fixture 10.

In order to impart stability during the test, and to insure a good ground contact, means 40, usually in the form of pressure columns, are adapted to press against the at least one ground flange of the device 100, so as maintain the device 100 on the top surface 23 of the column 21. These pressure columns can be in an insulating material, or in a conducting material.

Since the blocks 25 are vertically adjustable, means must be provided to maintain them is a predetermined vertical position. In a preferred embodiment of the invention, each block 25, each opposite side 13, 15 and the device supporting column 21 are provided with a vertical slot 22, 14, 16 and 20, respectively. The means thus include a bolt 201 passing through each of the slots 22,14, 16 and 20, at having at least one threaded end 203 and a nut 205. Once the blocks 25 and the column 21 have been placed in the desired vertical position, the nut 205 is tightened and the assembly thus remains secured. It should however be understood that other means to maintain the components in their desired vertical orientation are well within the scope of the present invention, and that the important aspect of the invention does not lie therein.

As better shown in FIG. 1, each conductor 31 is secured to an opposite side 13, 15 (or leg) of the device through a connector 34. Connectors 34 can be any type of connector used in microwave devices, such as SMA or N, and preferably have a ground portion, which is secured, for example through screws, to the ends 13, 15. Consequently, the connector 34 is connected to conductor 31, and the fixture including the ends 13, 15, the top 17, blocks 25 and column 21 are all held at ground. It is for this reason that pressure columns 40 do not require to be made of an insulating material. The signal that will be applied to the conductor 31 will be almost completely isolated from the rest of the fixture. It should be noted that the above description for the connectors should not be taken as limitative, and that such connectors are well-known in the art.

The purpose of the invention is to provide an adjustable low-loss test fixture, so that the impedance of the transmission line going from the connector 34 to the device can be varied according to the device's specifications. By modifying the distance between the bottom surface 26 of the top 17 (or bridge) and the top surface 27 of the blocks, the impedance of the transmission line will vary and can be made to look like a 50 ohm line whatever DUT 100 is placed within the device 10. Accordingly, a variety of different devices can be tested with the present invention, which is thus more versatile.

Figure 3:
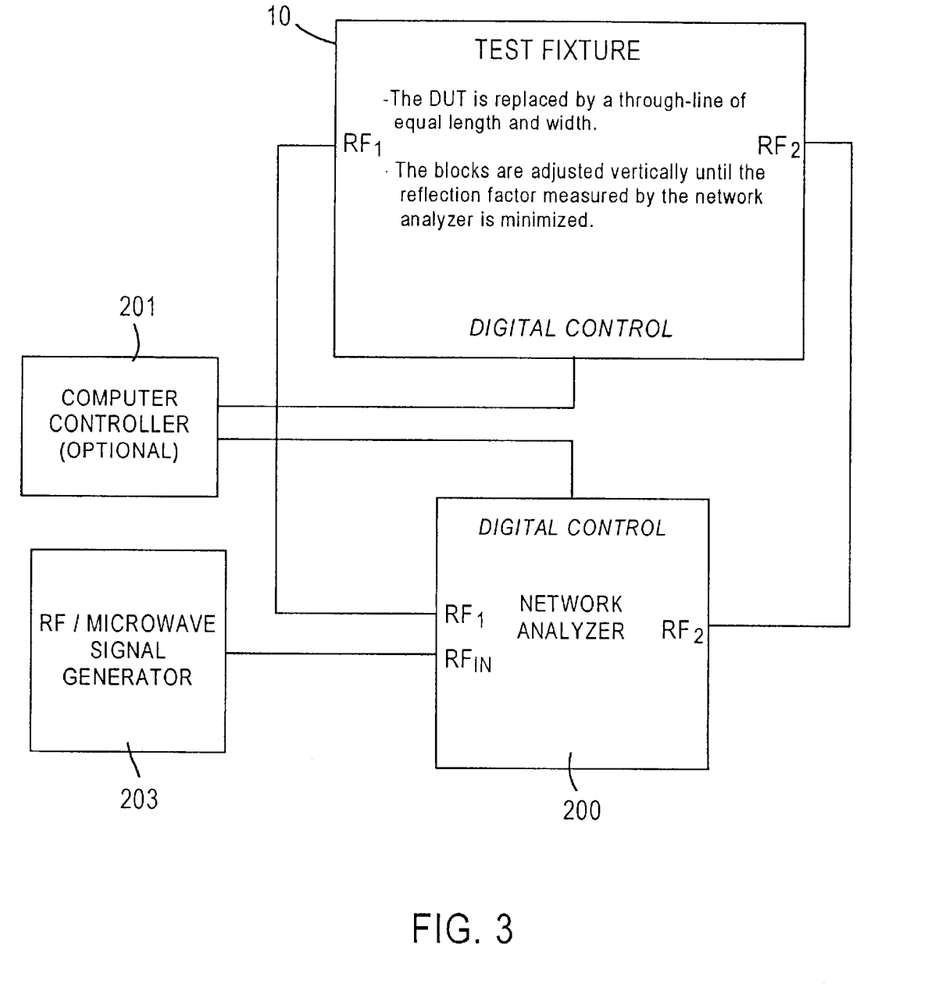
FIG. 3 is a schematic representation of the set-up for calibrating the fixture of FIG. 1.

FIG. 3 is a schematic representation of the calibration set-up for the test fixture 10 of the present invention. The test fixture 10 is connected to a network analyser 200, which receives as an input a signal from a signal generator 203. The setup is optionally controlled by a computer 201.

The scope of the invention as defined in the appended claims is directed, singly or in combination, to a dielectricless mechanical test fixture structure capable of handling high powers; a new mechanical approach based on brackets to secure and hold in place device packages flanges; a new overall geometry along the transitions, in which mismatches are compensated by vertical asymmetry of the transmission lines going from the brackets holding the device package flanges to the connectors; and a new method to adjust the inserts in the test-jigs so as to attain a characteristic impedance of 50 Ohms.

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. A low-loss microwave device test fixture, said device having at least two flanges lying on an axis and projecting on opposite directions from the device, and at least one ground flange, said test fixture comprising:

a frame having two opposite extremities, a top, a bottom, a height, and a width;

a device supporting column located between said opposite extremities, having a top surface lying below said top of said frame and adapted to receive said device, said column having a height less than said height of said frame;

two adjustable blocks, each located between the device supporting column and an opposite extremity, said blocks being vertically adjustable;

two brackets for receiving a flange from the device, the brackets lying above the column and the blocks, each bracket being secured to an opposite extremity of the frame;

means for securing said device to said column; and means for securing said column and said blocks at a given vertical position.

2. A low-loss microwave device test fixture according to claim 1, wherein each of said device supporting column, said adjustable blocks and said frame are provided with a vertical slot having a predetermined length, and wherein said means for securing said column and said blocks at a given vertical position include a bolt having at least one threaded opposite end, said bolt passing through each of the vertical slots and a nut adapted to tighten said bolt.

3. A low-loss microwave device test fixture according to claim 1, wherein said means for securing said device to said column include pressure column extending downwardly from said frame towards said column for pressuring the at least one ground flange of the device on the column.

4. A low-loss microwave device test fixture comprising:

a frame having two opposite legs, a top, a bottom, a width and a height, said frame also including a bridge at the top thereof for joining the two opposite legs;

a central column adapted to receive a bottom surface of a device, including at least one ground flange, said column being vertically adjustable and being located between said two legs below said bridge;

two flange retaining brackets defining a signal path, each bracket being secured to an opposite leg, said brackets extending towards each other and lying between said column and said bridge;

a block located below each bracket and being vertically adjustable so as to modify the characteristic impedance along the signal path; and means for securely retaining the blocks and the column in a given vertical position.

5. A low-loss microwave device test fixture according to claim 4, wherein said flange retaining brackets include a longitudinal slot having a length, a width and being provided with pressure means for securely retaining a flange therein.

6. A low-loss microwave device test fixture according to claim 5, wherein said pressure means include a screw.

7. A low-loss microwave device test fixture according to claim 5, wherein said pressure means are defined by the shape of said slot tapering inwardly.

8. A low-loss microwave test fixture according to claim 5, wherein said pressure means include at least one strip within said slot and a resilient member for pushing a free edge of said strip within said slot.

\* \* \* \* \*